US008693708B2

(12) United States Patent
Cronmiller

(10) Patent No.: US 8,693,708 B2
(45) Date of Patent: Apr. 8, 2014

(54) SYSTEM FOR OPERATING A DEVICE FOR PRODUCING AN AUDIBLE ALARM

(75) Inventor: James J. Cronmiller, West Henrietta, NY (US)

(73) Assignee: Star Headlight & Lantern Co., Inc., Avon, NY (US)

( * ) Notice: Subject to any disclaimer, the term of this patent is extended or adjusted under 35 U.S.C. 154(b) by 695 days.

(21) Appl. No.: 12/806,908

(22) Filed: Aug. 24, 2010

(65) Prior Publication Data

US 2012/0051563 A1 Mar. 1, 2012

(51) Int. Cl.
*H04R 3/00* (2006.01)
*H03F 99/00* (2009.01)

(52) U.S. Cl.
USPC ............ 381/117; 381/111; 381/116; 381/120

(58) Field of Classification Search
USPC .................................. 381/120, 111, 116, 117
See application file for complete search history.

(56) References Cited

U.S. PATENT DOCUMENTS 4,065,714 A * 12/1977 Hill ............................... 324/314
4,592,087 A * 5/1986 Killion .......................... 381/312
4,689,609 A 8/1987 Ko et al.
4,790,020 A 12/1988 Lin
4,847,590 A 7/1989 Gosswiller
4,885,567 A 12/1989 Katz
4,893,343 A 1/1990 Bader
4,903,007 A 2/1990 Gottlieb
4,963,855 A 10/1990 Kojima
4,975,965 A 12/1990 Adamson
5,323,456 A * 6/1994 Oprea ...................... 379/375.01
5,804,774 A 9/1998 Ford et al.
5,895,997 A * 4/1999 Puskas et al. ............ 310/316.01
5,936,446 A * 8/1999 Lee ............................... 327/172
5,970,158 A 10/1999 Beltran
6,009,311 A * 12/1999 Killion et al. ................ 455/63.1
6,127,918 A 10/2000 Lin
6,166,623 A 12/2000 Coward
6,411,072 B1 * 6/2002 Feldman ....................... 323/299
6,516,076 B1 2/2003 Marlin
6,580,260 B2 * 6/2003 Takita ........................... 323/299
6,642,837 B1 * 11/2003 Vigoda et al. ................ 340/10.1
6,944,284 B2 * 9/2005 Goodings ................ 379/373.02
6,977,584 B2 12/2005 Milliken (Continued)

OTHER PUBLICATIONS

U.S. Appl. No. 29/316,825, filed Nov. 5, 2009.

(Continued)

*Primary Examiner* — Duc Nguyen
*Assistant Examiner* — Sean H Nguyen
(74) *Attorney, Agent, or Firm* — Kenneth J. Lukacher Law Group

(57) ABSTRACT

A backup alarm for producing an audible warning signal which warbles or beeps, at selected audible output power (Db) levels includes a computer which drives a speaker by switching drive voltage to the speaker with above audible, high frequency pulses in packets repetitive at audible frequency. The high frequency pulses are pulse width modulated at different ratios selected from tables in memory of the computer in accordance with the voltage from a battery power source which provides the drive voltage so that the audible output power remains constant at the selected level over a wide range of power source voltage. By providing for warning/alarm signal generation by means of an operating system which provides both high, above audible frequency and audible frequency switching, power conservation and warning signal output power control are accomplished without interference.

20 Claims, 6 Drawing Sheets

(56) References Cited

U.S. PATENT DOCUMENTS

Figure 1:
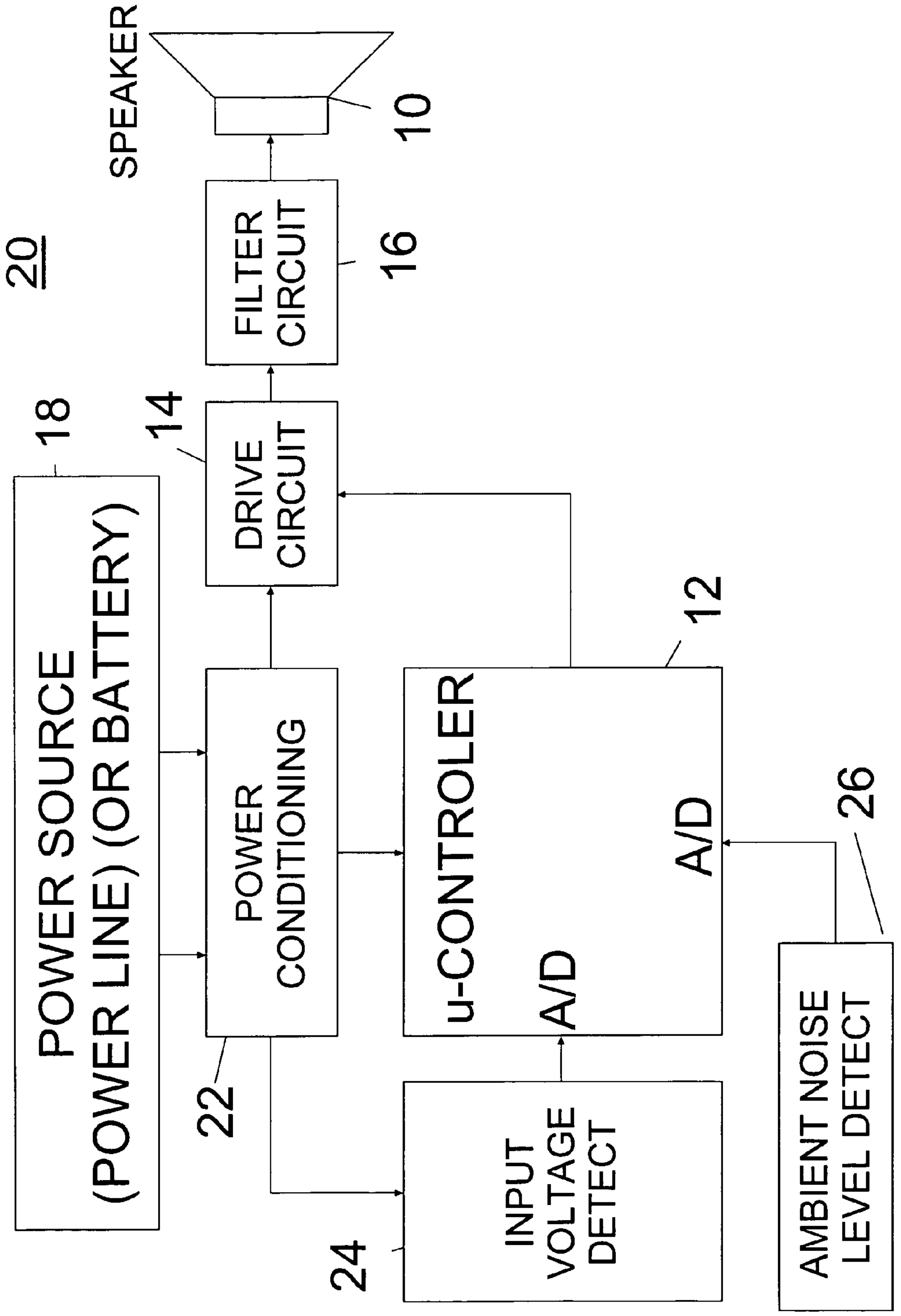

| | | | | |
|---|---|---|---|---|
| 7,146,011 | B2 * | 12/2006 | Yang et al. | 381/77 |
| 7,215,788 | B2 * | 5/2007 | Hooley | 381/120 |
| 7,459,968 | B2 * | 12/2008 | Ohama et al. | 330/10 |
| 7,617,794 | B2 | 11/2009 | Chlystek | |
| D615,443 | S | 5/2010 | Datz et al. | |
| 8,013,677 | B2 * | 9/2011 | Kaya et al. | 330/207 A |
| 8,070,108 | B2 * | 12/2011 | Severson | 246/1 R |
| 2001/0040508 | A1 * | 11/2001 | Janning et al. | 340/573.3 |
| 2003/0120367 | A1 * | 6/2003 | Chang et al. | 700/94 |
| 2005/0200405 | A1 * | 9/2005 | Shinohara et al. | 330/10 |
| 2005/0276432 | A1 | 12/2005 | Hsieh | |
| 2006/0280315 | A1 * | 12/2006 | Norris et al. | 381/77 |
| 2007/0078487 | A1 * | 4/2007 | Vaisnys et al. | 607/8 |
| 2007/0154035 | A1 * | 7/2007 | Fukui | 381/116 |
| 2007/0173291 | A1 * | 7/2007 | Morotomi | 455/566 |
| 2007/0230718 | A1 * | 10/2007 | Oda | 381/117 |
| 2008/0074183 | A1 * | 3/2008 | Tai | 330/10 |
| 2008/0111620 | A1 * | 5/2008 | Menard et al. | 330/10 |
| 2008/0219458 | A1 * | 9/2008 | Brooks et al. | 381/57 |
| 2008/0223641 | A1 * | 9/2008 | Elson | 180/167 |
| 2008/0232608 | A1 * | 9/2008 | Ullmann | 381/77 |
| 2009/0088224 | A1 * | 4/2009 | Le Gall et al. | 455/570 |
| 2009/0116654 | A1 * | 5/2009 | Hansen et al. | 381/28 |
| 2009/0310709 | A1 * | 12/2009 | Bare | 375/300 |
| 2010/0189295 | A1 | 7/2010 | Datz et al. | |
| 2010/0201299 | A1 * | 8/2010 | Emde et al. | 318/503 |
| 2010/0231368 | A1 * | 9/2010 | Nakayama et al. | 340/425.5 |
| 2011/0305356 | A1 * | 12/2011 | Kwan et al. | 381/190 |
| 2011/0320278 | A1 * | 12/2011 | Littman | 705/14.58 |
| 2012/0063505 | A1 * | 3/2012 | Okamura et al. | 375/238 |
| 2013/0010979 | A1 * | 1/2013 | Takara et al. | 381/77 |

OTHER PUBLICATIONS

U.S. Appl. No. 12/927,046, filed Nov. 5, 2010.

* cited by examiner

| | 87 Db | 98 Db | 107 Db |
|---|---|---|---|
| 12v | 25% | 65% | 97% |
| 14.5v | 19% | 48% | 69% |
| 17v | 14.5% | 37% | 58% |
| 20v | 11% | 28% | 45% |
| 22v | 9.5% | 26% | 42% |
| 25v | 8.5% | 23% | 35% |
| 28v | 8.0% | 19% | 31% |
| 30v | 7.6% | 18% | 28% |
| 33v | 7.0% | 16% | 24% |
| 35v | 6.7% | 15% | 21% |
| 38v | 6.5% | 14% | 19% |
| 40v | 6.0% | 13% | 17% |
| 43v | 5.5% | 11% | 15% |
| 45v | 5.0% | 10% | 14% |
| 48v | 4.6% | 9% | 12% |

FIGURE 5

SYSTEM FOR OPERATING A DEVICE FOR PRODUCING AN AUDIBLE ALARM

The present invention relates to audible alarm generation and particularly to a system which operates a device capable of producing an audible alarm, such as a speaker of a unit which generates an audible warning signal. The invention is especially suitable for providing an electronic system for operating a speaker in a backup alarm which produces an audible tone which warbles or beeps, when a vehicle is driven in a reverse or backup direction.

It is a feature of this invention to provide a universal, versatile operating system capable of using operating power over a voltage range significant to encompass voltages which may be produced by various types of power sources, such as batteries, which may be installed in various construction and emergency vehicles and operating equipment found in factories, construction sites, and also on off-road vehicles. The systems accommodate differences and variation in the voltages of these power sources, which variations may occur over periods of use, as due to battery discharge. The versatility provided by the invention also includes the applicability of the invention to provide compact units, such as compact backup alarms, by avoiding the need for massive heat dissipation structures, which would be incompatible with a compact unit. The invention also enables the same device to provide audible outputs of different intensity thereby enabling the speaker which produces the alarm or warning signals to operate at different intensity levels, for example standard decibels (Db) levels of 87, 97, 102, and 107 dB; the output Db level being pre-set, or automatically selectable in accordance with the ambient noise level of the environment in which the audible alarm or warning signal is produced.

Backup alarms and warning and alarm signal generating units of the type which may include the invention, typically utilize speakers of the type which are available from many suppliers. Reference may be had to U.S. patents to Gottlieb, U.S. Pat. No. 4,903,007, issued Feb. 20, 1990; Coward, U.S. Pat. No. 6,166,623, issued Dec. 26, 2000; and Milliken, U.S. Pat. No. 6,977,584, issued Dec. 20, 2005, for examples of such speakers. Backup alarm speaker units may also be similar to those shown and described in the following U.S. patent applications assigned to the same Assignee as the present invention: Neufeglise et al., U.S. patent application Ser. No. 29/316,825, filed Nov. 5, 2009; and Neufeglise et al., U.S. patent application Ser. No. 61/280,548, filed Nov. 5, 2009. Reference may also be had to the following applications, assigned to the Assignee of the present invention, which are especially suitable for use in police and other emergency vehicles, and the references cited in these applications, for speakers which can produce alarm and warning signals: U.S. patent application Ser. No. 12/321,922, filed Jan. 27, 2009, in the name of Datz and Cronmiller, for Loudspeaker, and Datz and Cronmiller, Horn Loudspeaker for Providing Warning and Announcement Signals, Especially in Emergency Vehicles, U.S. patent application Ser. No. 29/313,620, filed Jan. 27, 2009.

A system in accordance with the present invention for providing audible alarm and warning signals with such speakers which are universally useful with power supplies having voltage outputs over a large range of voltages, and which may occupy a limited or compact space by avoiding the use of heat dissipation members or heat sinks which are not compatible for use in such compact space, and also which can provide the alarm or warning audible outputs at different intensity (Db) levels, uses a digital switching system which produces operating pulses for driving the speaker at a constant power output which may be selected from different power outputs each corresponding to a different Db level of the audible warning or alarm signal produced by the speaker. The pulses are generated digitally with the aid of a computer which produces the pulses at above audible frequency in packets repetitive at a selected audible frequency, to provide the alarm or warning signal. The pulses in the packets are pulse width modulated at a pulse width modulation (PWM) ratio, which is the ratio of the on to off duration of the pulses and which corresponds to the duty cycle thereof. The PWM ratio depends upon the operating voltage of the source which provides power to the system and powers the loudspeaker so the selected constant power output is maintained notwithstanding different power source voltages and variations in voltage from the power source. The PWM ratios are digitally stored in a table or tables, which may be different registers or different parts of a register of a computer (suitably any microprocessor or microcontroller). The computer includes counters and timers controlled by the PWM ratio information in the tables so as to provide PWM output pulses at the frequency well above the audible range. These supersonic signals are operative to drive the loudspeaker in a switching mode, thereby reducing heat dissipation as would otherwise be necessary to regulate and provide a constant voltage over a wide range of voltages as may be provided by different voltage sources (batteries of different power; for example, 12v, 24v, 36v, and 48v batteries). The packets are produced in groups at a rate, for example, during half a period of a warble or beep frequency, so that the alarm signal may warble or beep at the warble rate, for example, 60 Hz.

The features of the invention which provide for the universal applicability of the system for driving the speaker, namely minimize heat dissipation for compatibility with compact installation, and selectable audible alarm or warning signal output Db levels are accomplished without interference with each other through the use of pulses above audible frequency of different PWM ratio and in packets repetitive at audible frequency thus provide both high frequency and low frequency switching of speakers operating voltage for power conservation and reduction of the need for heat dissipating facilities as well as the generation of alarm signals having different tonality in the audible range. A warning or alarm signal of tonality which can be a warbling tone is provided by the invention.

Accordingly, it is the principal object of the present invention to provide an improved driving system for an alarm or warning signal generator in which the foregoing disadvantages are substantially eliminated and which is of universal applicability with power sources of different voltage output, and also which produces output acoustic power of different selected levels.

Figure 2:
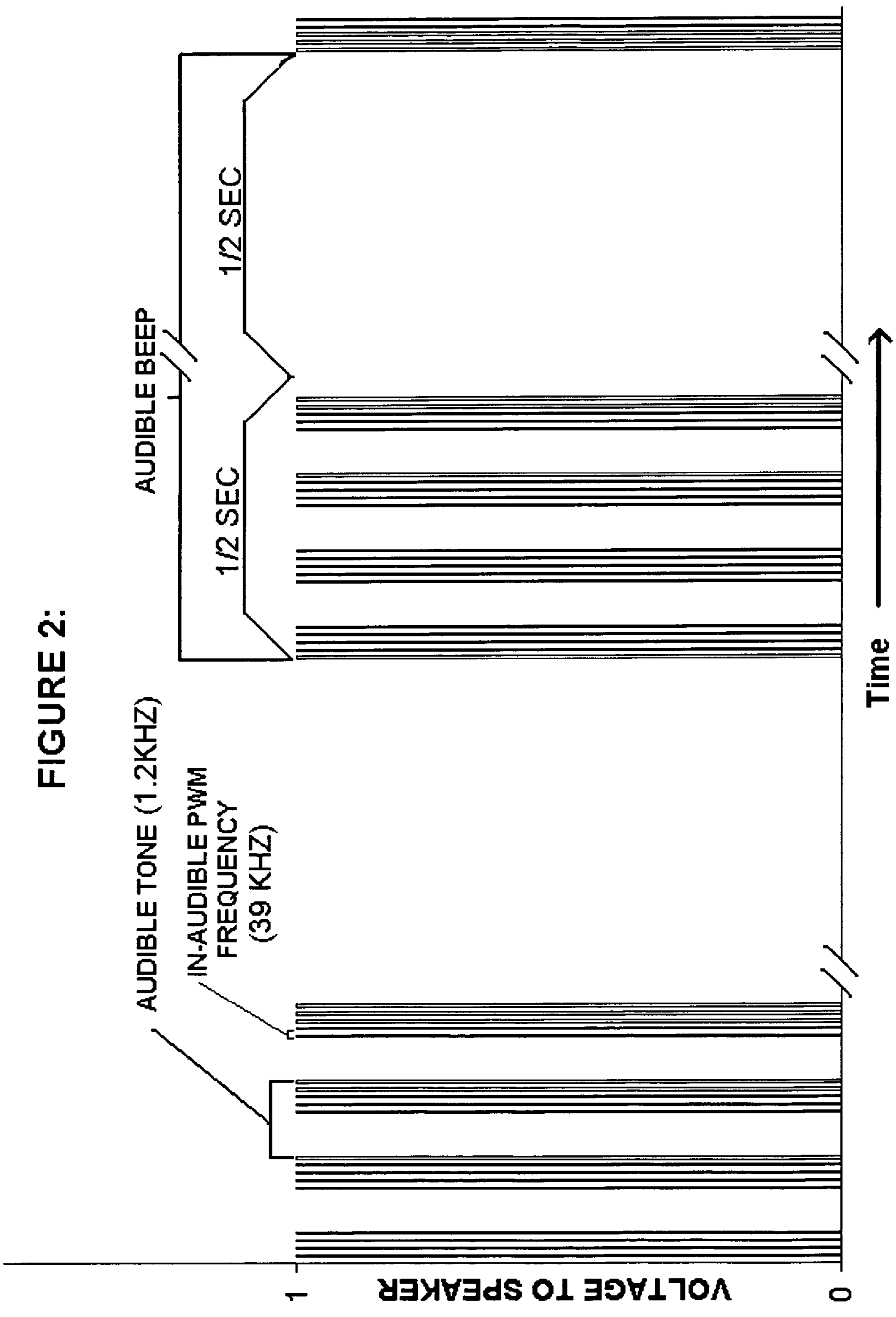
Figures 3A, 3B, 3C:
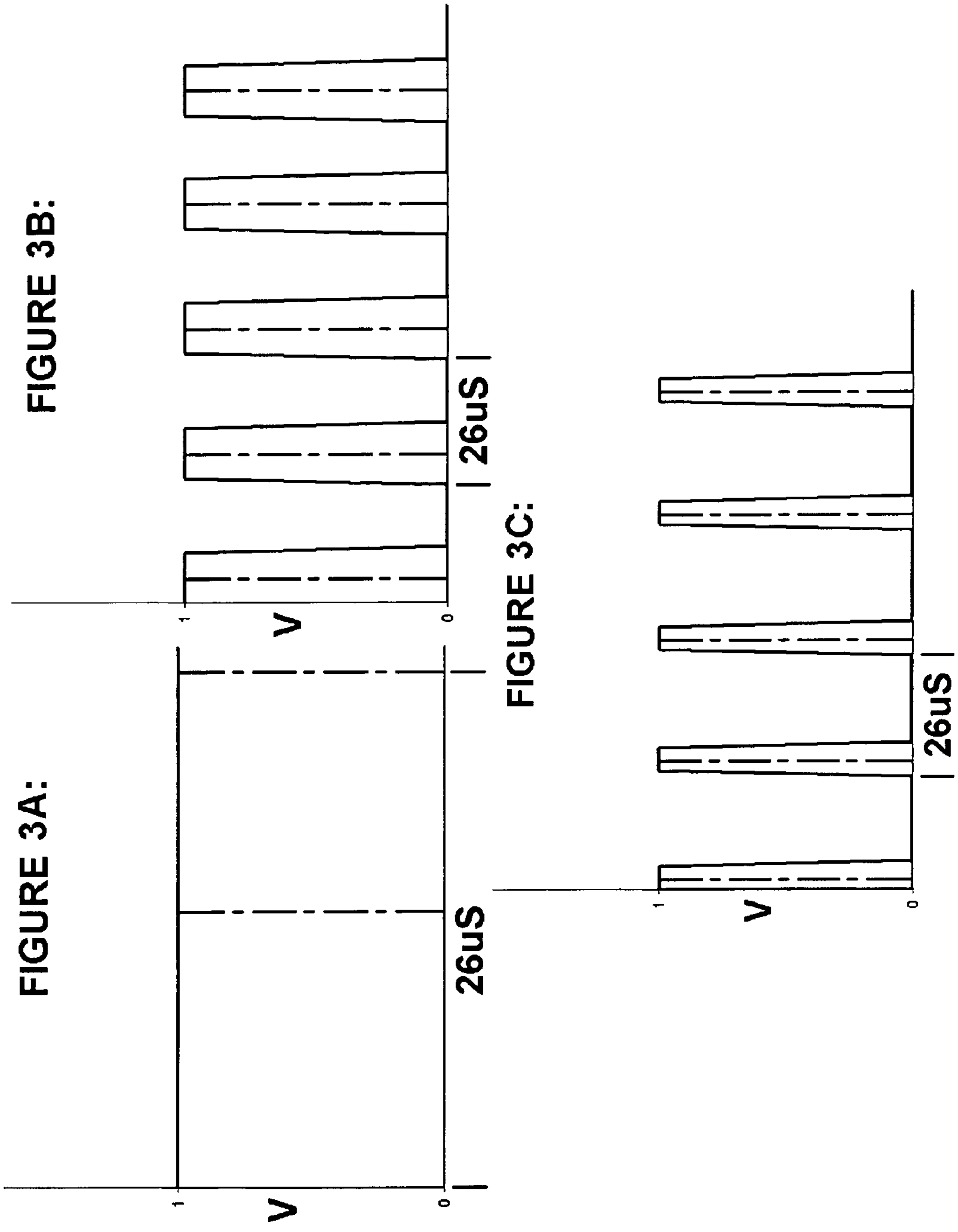
Figure 4:
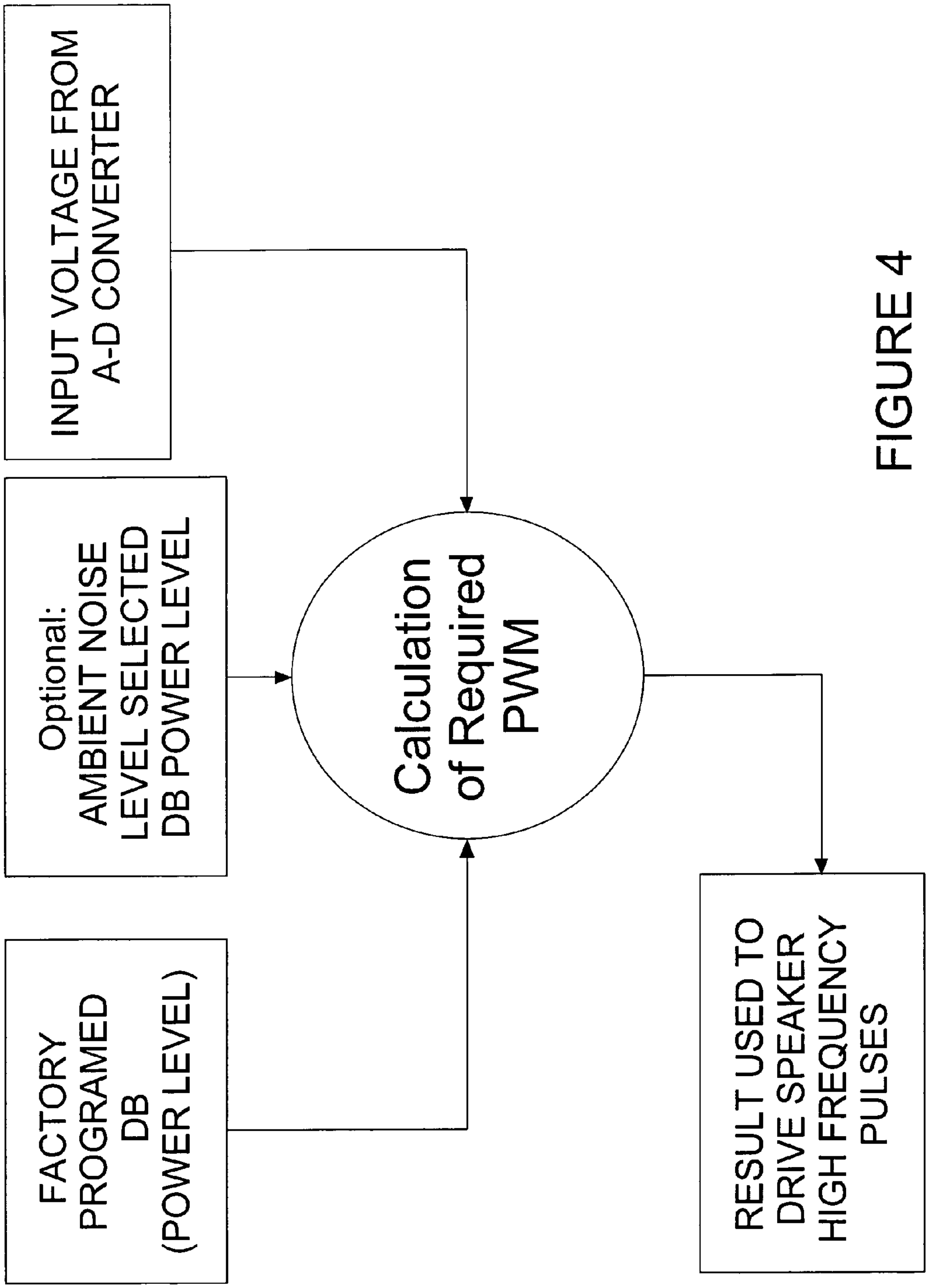
Figure 6:
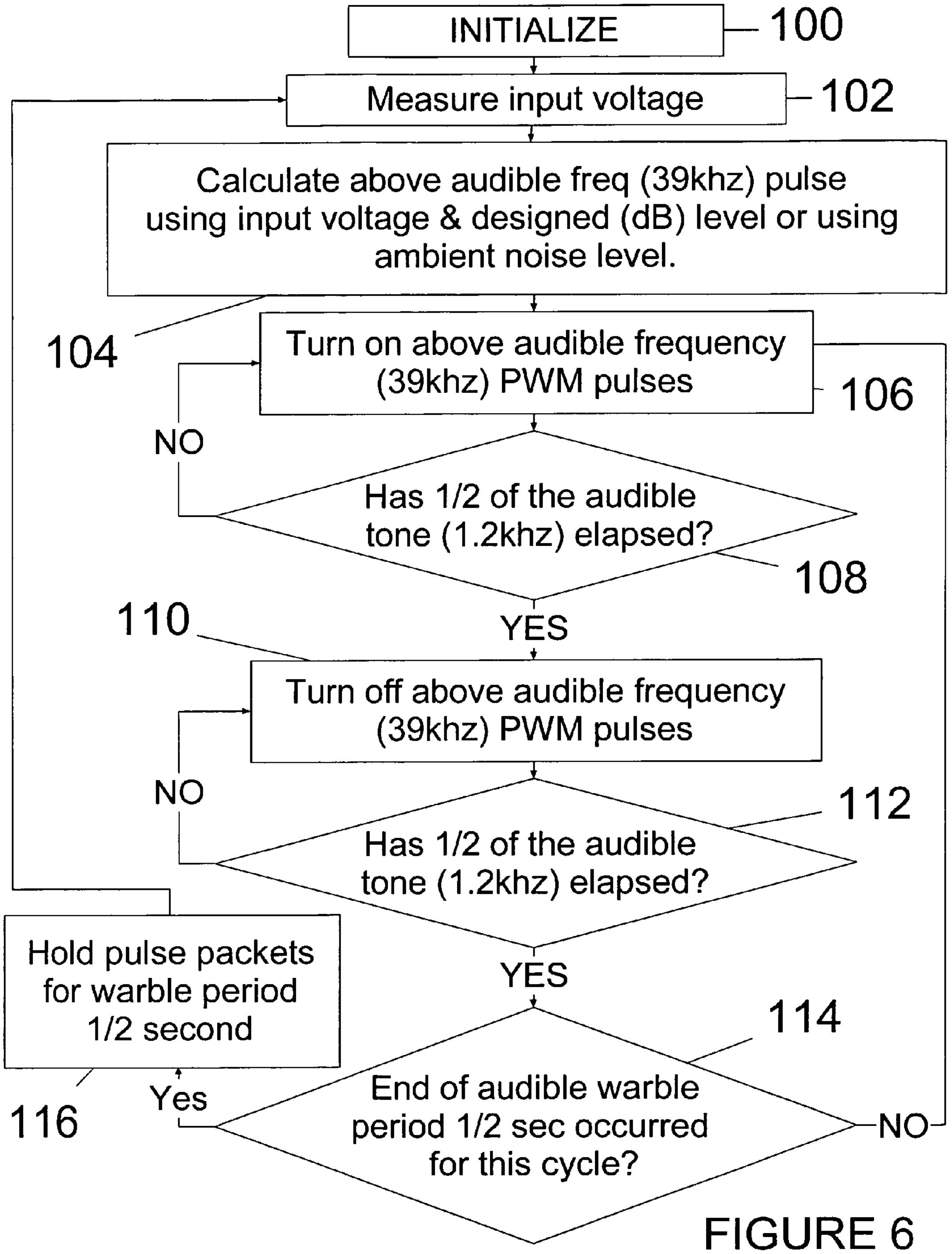

The foregoing and other objects, features and advantages of the invention will become more apparent from a reading of the following description in connection with the accompanying drawings, in which:

FIG. 1 is a block diagram of an alarm and warning signal generating system which incorporates the invention;

FIG. 2 is a diagram illustrating the pulses which are provided by the system to operate a speaker, which pulses are inaudible or supersonic PWM high frequency pulses, and which pulses are produced in packets audible at the rate of the audible tone which provides a warning or alarm signal, and which packets are produced in groups which are repetitive at a warble frequency so that the tone is manifested in audible beeps;

FIGS. 3A, 3B, and 3C represent the PWM high frequency pulses in a packet which is presented as a switching voltage to drive the speaker in three cases, namely where the input voltage from the power source is low (FIG. 3A), where the input voltage from the power source is medium (FIG. 3B), and where the input voltage from the power source is high (FIG. 3C), the pulses in FIGS. 3A, B, and C are shown in dot-dash lines to illustrate the PWM ratios depend upon whether the audible output power from the speaker is at a high power (Db) level and a low power level;

FIG. 4 is a simplified flow chart illustrating operation of the computer system to produce high frequency (above audible frequency pulses) with different PWM ratios which switch the voltage to the speaker to efficiently drive the speaker at audible frequency over a wide range of operating voltages from a power source;

FIG. 5 are illustrative tables which are stored in the computer (microprocessor) shown in FIG. 1, so as to provide constant audible power output notwithstanding voltage from the power source being over a wide range of voltages (12-48 volts) and where the audible output is at different loudness (Db) levels, namely 87, 98 and 107 Db; and FIG. 6 is a more detailed flow chart illustrating the programming of the microprocessor computer of FIG. 1 to provide the PWM pulses in packets at a warble or beeping rate.

Referring to FIG. 1, the system of circuits provided by the invention operates a backup alarm device or unit 20 having a speaker 10, which may be of the type shown in the above-referenced patents and applications. The speaker is driven by pulses from a microprocessor computer (microcontroller or controller) 12 through a drive circuit (or driver) 14, which may be provided by a transistor switch driven by the microprocessor 12. The drive circuit 14 outputs pulses to a filter circuit 16 which remove transients, for example, by capacitive coupling via a resistor/capacitor coupling circuit. The drive circuit 14 is powered from a power source 18 which may be the power lines from the battery of the vehicle or other equipment which is provided with the backup alarm 20. This power source may be connected to the alternator or other electrical equipment in the equipment in which the backup alarm 20 is installed and is therefore subject to noise which is removed by power conditioning 22. Such conditioning may include a circuit having a MOV (metal oxide varistor) and a filter capacitor which cleans up the voltage from the source 18. Power conditioning also obtains operating voltage (e.g., +5v) for operating the microprocessor 12. The power conditioning circuitry 22 also provides operating voltage for the drive circuit 14 which is switched under computer control by the microprocessor 12 to power the speaker.

The microprocessor 12 has a plurality of input ports. Two of these input ports are analog to digital (A/D) converter ports. An input voltage detect circuit 24 may include a voltage divider to provide an input voltage to a first one of these A/D converter ports, such that the input voltage to this port does not exceed maximum safe voltage compatible with the microprocessor, for example, 5 volts maximum. A resistive voltage divider may be used in the input voltage detect circuit 24 reduces the source voltage to the voltage compatible with the input ports of the microprocessor. The second of the A/D input ports may optionally be used to receive signals from an ambient noise level detector 26, which may be either a separate microphone, or the speaker 10 may be switched to a microphone mode to detect the ambient noise in the environment. As will be described below, the ambient noise level may be used to control the PWM pulses which drive the speaker 10 at selected power levels, for example, 87, 98, 102 and 107 Db.

The microprocessor 12 also has an output port which provides the high frequency pulses to drive circuit 14 which switch the speaker 10 and are produced in packets, which are illustrated in FIGS. 2 and 3 to be described below. For example, the microprocessor may be a type 12F683 chip which is available from The Microchip Company of Chandler, Ariz., USA. The microprocessor 12 includes clocks and counters which afford timers so as to translate the clock into the high frequency (above audible range pulses), the PWM ratio of which determines the output acoustic power of the alarm or warning signal from the speaker 10. The microprocessor 12 also includes memory having registers or a single register which is divided into tables which represent the PWM ratio of the high frequency pulses. The data from the table(s) determines the PWM ratio of the pulses and therefore the output power from the speaker.

In operation, the microprocessor 12 outputs high (in-audible) frequency (e.g., 39 kHz) pulses in packets at an audible rate (e.g., 1.2 kHz). Each packet is a series of these high frequency pulses, e.g., five in number over approximately 0.8 mS duration. Each pulse has a cycle or period (e.g., 26 μS) and a pulse width (or duty cycle) over this period. The pulse width ratio (or percentage of on to off in the period) is modulated (changeable) as determined by table(s) in memory of the microprocessor 12 in accordance with the voltage of source 18 and the desired loudness (or volume) from the speaker 10, i.e., output (or power) level (dB). For example, the pulse width of each high frequency pulse increases over its cycle as the voltage of the source 18 decreases for the same loudness level. The packets at their audible rate are preferably periodic over an "on" interval and then an "off" interval to produce a beep or warble, for e.g., the on and off intervals may each be ½ second in duration. Other frequency of pulses, pulse cycle or period, number of pulses per packet, packet duration, audible rate, and on and off intervals, may also be used, to provide the desired performance of backup alarm device 20. The operation of the microprocessor 12 is further described below.

The PWM ratio is controlled by two variables: first, the audible power output; and second, the input voltage from the power source 18, so as to obtain constant output power over a large range of operating voltages which in this example, are in the range from 12 to 48 volts from the source 18. The microprocessor 12 operates by reading out the clock for time periods determined by the data point which is selected in response to the input voltage from the input voltage detect circuit 24 in the table or part of the table corresponding to the speaker output level (Db) which is selected either by being pre-selected at the factory (factory programmed), or is a table which is selected to accommodate the ambient noise level by the output from the A/D port to which the ambient noise level detector 26 is connected. When this A/D port is used, the microprocessor 12 is programmed to select one of the output levels of the speaker 10 by comparing the level detected with predefined threshold levels in memory of the microprocessor to enable (if possible) the speaker to output sound above the ambient noise when the backup alarm is activated.

The PWM ratios take into account not only the variations in input voltage, but also the inductive reactance of the speaker 10. This inductive reactance effectively shortens the pulses which are applied to the speaker via the drive circuit 14 and the filter circuit 16. Thus, the PWM ratios stored in the table are modified to compensate for the less than instantaneous rise time of the pulses due to the inductive load presented by the speaker.

The tables are designed empirically or computed off-line, considering the desired power levels from the speaker and the PWM ratios needed to compensate for variations in the power source voltage read by the microprocessor 12 from the output of the input voltage detect circuits 24.

FIG. 5 shows three examples (data points in the table(s)) based on different input voltages (the first variable discussed above) and the backup alarm designed Db levels, which for example, are illustrated columns labeled 87, 98 and 107 Db. The percentage "on" times corresponding each data point in the tables is the PWM ratio or the time periods during which the high frequency pulses are "on" during a cycle of the high frequency pulses. For example, at a 87 Db output level when the voltage of source 18 is at 12V the pulse width of the each high frequency output pulse is at 99-100% of its cycle (i.e., the pulse is "on" for all or almost all over its cycle, whereby the pulses of a packet may merge—see for example FIG. 3A described below), and when the voltage of source 18 is at 48V the pulse width of each high frequency output pulse is at 95% of its cycle (i.e., the pulse is "on" for the first 95% of its cycle, and then off the remaining 5% of its cycle). Thus, as speaker 10 outputs sound at a certain output power level in response to its driver 14 receiving pulses from microprocessor 12, the pulse width increases when the voltage of the source (or battery) decreases in order to maintain constant (or at least substantially constant) the output power level of sound from speaker 10. The range of PWM ratios (or widths) of the pulse width over the range of battery voltages may be different for different output power levels of sound from speaker 10, as shown in the FIG. 5 example.

FIG. 2 illustrates that the high frequency pulses occur in packets. The packets are repetitive at the audible frequency. For example, the audible frequency may be a 1.2 KHz tone. Thus, the period of the packets is approximately 0.8 milliseconds (ms). The high frequency or above audible frequency pulses, which may be, for example, at supersonic frequency of 39 KHz and have different PWM ratios. In other words, the pulse on time is less when the input voltage from the source 18 is high (FIG. 3C). When the input voltage is medium, the PWM ratio is increased (FIG. 3B). Finally, when input voltage is low (FIG. 3A), the packets merge into single pulses of full duration (26 microseconds at a frequency of 39 KHz). If a lower power level is desired, the PWM ratios are reduced. The pulses then are less in duration and have a lower duty cycle or PWM ratio than for the higher power case. These PWM 39 KHz pulses for the lower power case is shown in dot-dash lines.

As shown in FIG. 2, the packets are repetitive in groups. Each group is shown to be approximately ½ second long with a ½ second off period between the groups. This imposes a 60 Hz or ½ second ½ period beep or warble on the audible signal produced by the speaker 10.

In general, the program in the microprocessor 12 operates in accordance with the flow chart of FIG. 4 based on the factory programmed Db (power level from the speaker) or a selected power level determined by the ambient noise level as obtained from the detector 26 (FIG. 1). One of the variables for the calculation of the required PWM ratio of the above audio high frequency pulses in the packets is utilized together with the second variable, which is the input voltage to A/D converter of the microprocessor 12 which reads the input voltage detect circuit 24 and therefore responds to the power source voltage level and provides the data used in the calculation of the required PWM ratio. This calculation involves selection of the table data corresponding to the input voltage from the source and the factory programmed or automatically selected Db power level. The result is used by microprocessor to send pulses to the drive circuit 14 in accordance with the PWM ratio found in the table, to drive the speaker at the programmed (or selected) power level, which is constant notwithstanding the variations in input voltage from the source 18.

The program in the microprocessor 12 is summarized in the flow chart of FIG. 6. First, the microprocessor is initialized by re-setting its registers, timers and counters. This is shown at 100 in the flow chart of FIG. 6.

The input voltage is then measured at the input to the microprocessor. This measurement is indicated at 102. In the next operation indicated at 104, the tables in the microprocessor are accessed to look up the required PWM ratio of the above audible frequency (39 KHz) pulses based upon the measured input voltage and the selected level of the audible output (the backup alarm designed dB level). Alternatively, ambient noise level is used to select the Db level. Then, in operation 106, the high frequency PWM pulses are turned on at the above audible frequency (39 KHz). Next, a decision is made that half of the period of the audible tone (1.2 KHz) has elapsed. This decision is shown at 108. If the period has elapsed, then the operation at 110 is carried out to turn off the above audible, high frequency 39 KHz pulse PWM pulse packets. The next decision is a timing decision 112 as to whether the second half of the audible tone period has elapsed. This completes a packet cycle as shown in the bracket entitled audible tone in FIG. 2. As shown in FIG. 2, the packets continue until the end of half the warble period (½ sec) when decision 114 is made that the end of half the warble period (½ sec.) has occurred for the cycle. This condition shown as a series of 4 packets which take place over a ½ sec. period in the diagram of FIG. 2. Next, decision is made to hold the pulse packets output off for the second half of the warble period, for another ½ sec. This operation is indicated at 116 in FIG. 6. Accordingly, a warble or audible beep is imposed on the audible output from the loudspeaker as is desirable for use in a backup alarm. The program then recycles to again measure the input voltage at 102.

From the foregoing description, it will be apparent that there has been provided an improved system for operating a loudspeaker to produce warning or alarm signals and especially beeping tones for backup alarm purposes. Variations and modifications of the herein described system within the scope of the invention will undoubtedly suggest themselves to those skilled in the art. Accordingly, the foregoing description should be taken as illustrative and not in a limiting sense.

The invention claimed is:

1. The method for driving a speaker which produces an audible acoustic output which comprises the steps of:

generating packets of pulses of like voltage in which said pulses are repetitive at a frequency above audible range and which said packets are repetitive at audible frequency using a power source the voltage of which is subject to variation over a given range of voltage; and changing the pulse width modulation (PWM) ratio of said pulses in each of said packets in response to the voltage of said power source so that said packets provide a constant power output, said pulse width modulation ratio being the ratio of on to off duration of said pulses which corresponds to the duty cycle thereof, and applying said constant power output to said speaker to provide said audible acoustic output to produce a warning signal, in which said PWM ratio to provide said constant power output is at least in accordance with the voltage of the power source and affect of inductive reactance of said speaker on rise time of pulses.

2. The method of claim 1 further comprising the step of generating said packets in sets which are repeated at a rate lower than said frequency at which said packets in said sets are repetitive to warble said audible acoustic output at said lower rate.

3. The method according to claim 1 further comprising the step of selecting different constant power outputs to produce said audible acoustic output at different selected level by providing different PWM ratios corresponding to the different constant power output which is selected.

4. The method according to claim 3 further comprising the step of measuring the ambient noise level in the vicinity of said speaker and selecting said different constant power outputs in accordance with the noise level so that said audible output is louder when said noise level is louder.

5. The method of claim 1 wherein said packet generating step comprises the steps of storing a table of different PWM ratios each corresponding to successive steps of voltage produced by said power source, said reading out said PWM ratio in said table which corresponds to the voltage from said source at said frequency above audible to provide the pulses in said packet having the PWM ratio corresponding to said constant power output condition.

6. The method of claim 3 where the step of selecting different constant power outputs comprises the steps of providing a plurality of tables of said different PWM ratios each for a different constant power output, and reading out said PWM ratio which corresponds to the voltage from said source at said frequency above audible from the table for the constant power output which is selected.

7. A system for driving a speaker which produces an audible acoustic output which comprises means for generating packets of pulses of like voltage in which said pulses are repetitive at a frequency above audible range and which said packets are repetitive at audible frequency using a power source the voltage of which is subject to variation over a given range of voltage, means for changing the pulse width modulation (PWM) ratio of said pulses in each of said packets in response to the voltage of said power source so that said packets provide a constant power output, said pulse width modulation ratio being the ratio of on to off duration of said pulses which corresponds to the duty cycle thereof, and applying said constant power output to said speaker to provide said audible acoustic output, wherein said speaker has inductive reactance, and said PWM ratio changed by said changing means is at least in accordance with the voltage of said power source and said inductive reactance affect on rise time of pulses.

8. The system of claim 7 further comprising means for generating said packets in sets which are repeated at a rate lower than said frequency at which said packets in said sets are repetitive to warble said audible acoustic output at said lower rate.

9. The system according to claim 7 further comprising means for selecting different constant power outputs to produce said audible acoustic output at different selected level by providing different PWM ratios corresponding to the different constant power output which is selected.

10. The system according to claim 9 further comprising means for measuring the ambient noise level in the vicinity of said speaker and selecting said different constant power outputs in accordance with the noise level so that said audible output is louder when said noise level is louder.

11. The system according to claim 7 wherein said packet generating means for storing in a computer, a table of different PWM ratios each corresponding to successive steps of voltage produced by said power source, said computer including means for reading out said PWM ratio in said table which corresponds to the voltage from said source at said frequency above audible to provide the pulses in said packet having the PWM ratio corresponding to said constant power output condition.

12. The system according to claim 9 wherein the means for selecting different constant power outputs comprises a computer having means for providing a plurality of tables of said different PWM ratios each for a different constant power output, and means for reading out said PWM ratio which corresponds to the voltage from said source at said frequency above audible from the table for the constant power output which is selected.

13. An audible alarm device which receives an input voltage from a source comprising:

a speaker providing an audible warning signal and having inductive reactance;

a detector for detecting an input voltage level;

a controller for outputting pulses at an inaudible rate in which each pulse has a pulse width, and said output pulses are outputted in packets at an audible rate, in which each of said packets has a number of said output pulses; and a driver for driving said speaker using said input voltage in response to said pulses outputted from said controller to enable said speaker to output sound, in which said pulse width of each of said pulses is set by the controller in accordance with at least the detected level of the input voltage and affect of inductive reactance on rise time of said pulses.

14. The device according to claim 13 wherein said controller outputs said packets at said audible rate over periodic on and off intervals to enable said sound from the speaker to beep or warble.

15. The device according to claim 13 wherein said driver for the speaker operates in response to said pulses to enable said speaker to output sound at a certain output power level, and said controller increases said pulse width of said output pulses when the voltage of the battery decreases to maintain substantially constant said output power level.

16. The device according to claim 13 wherein said driver for the speaker operates in response to said pulses to enable said speaker to output sound at a certain output power level, and said device further comprises an ambient noise level detector, wherein said controller receives said ambient noise level, and said output power level is varied by said controller in accordance with said ambient noise level received.

17. The device according to claim 15 wherein said pulse width of said output pulses change over a range of widths for different ones of said voltage from said battery, and said range of widths is different for different ones of said output power level.

18. The device according to claim 13 further comprising memory having a table storing pulse width settings for each of a plurality of different ones of the input voltage level, wherein said controller reads a pulse width setting from said table for the detected one of said plurality of different ones of said input voltage level, and sets said pulse width to said pulse width setting.

19. The device according to claim 13 wherein said audible warning signal is a backup warning signal for a vehicle.

20. The device according to claim 13 wherein said pulse width of each of said pulses is set by the controller further in accordance with one of a plurality of audible signal power levels.

* * * * *